(12) United States Patent
Franklin et al.

(10) Patent No.: US 10,025,557 B2
(45) Date of Patent: Jul. 17, 2018

(54) 8X8 BINARY DIGITAL MULTIPLIER

(71) Applicant: Firefly DSP LLC, Austin, TX (US)

(72) Inventors: Craig Franklin, Santa Barbara, CA (US); David Cureton Baker, Austin, TX (US)

(73) Assignee: Firefly DSP LLC, Austin, TX (US)

( * ) Notice: Subject to any disclaimer, the term of this patent is extended or adjusted under 35 U.S.C. 154(b) by 312 days.

(21) Appl. No.: 14/960,358

(22) Filed: Dec. 5, 2015

(65) Prior Publication Data

US 2017/0161021 A1    Jun. 8, 2017

(51) Int. Cl.
*G06F 7/52* (2006.01)
*G06F 7/523* (2006.01)
*H03M 7/30* (2006.01)

(52) U.S. Cl.
CPC .............. *G06F 7/523* (2013.01); *H03M 7/30* (2013.01); *H03M 7/3066* (2013.01); *H03M 7/6058* (2013.01)

(58) Field of Classification Search
None
See application file for complete search history.

(56) References Cited

U.S. PATENT DOCUMENTS

| | | | | |
|---|---|---|---|---|
| 6,571,268 B1* | 5/2003 | Giacalone | ................. | G06F 5/01 708/524 |
| 7,373,368 B1* | 5/2008 | Rarick | ................... | G06F 7/724 708/492 |
| 2002/0070781 A1* | 6/2002 | Vangal | ................... | G06F 7/607 327/202 |
| 2003/0145032 A1* | 7/2003 | Bradley | ................... | G06F 7/607 708/708 |

* cited by examiner

*Primary Examiner* — Michael D. Yaary

(57) ABSTRACT

An 8×8 binary digital multiplier reduces the height of partial product columns to be no more than 7 bits high. The six 7-bit high middle columns are each input to a (7:3) counter. An ascending triangle compressor operates on the lesser significant bit columns. A descending triangle compressor operates on the greater significant bit columns. The counter and compressor outputs are combined for a final stage of compression, followed by partial product addition.

6 Claims, 13 Drawing Sheets

Partial Product Term Columns

| 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
|  |  |  |  |  |  |  | r0c7 | r0c6 | r0c5 | r0c4 | r0c3 | r0c2 | r0c1 | r0c0 |
|  |  |  |  |  |  | r1c7 | r1c6 | r1c5 | r1c4 | r1c3 | r1c2 | r1c1 | r1c0 |  |
|  |  |  |  |  | r2c7 | r2c6 | r2c5 | r2c4 | r2c3 | r2c2 | r2c1 | r2c0 |  |  |
|  |  |  |  | r3c7 | r3c6 | r3c5 | r3c4 | r3c3 | r3c2 | r3c1 | r3c0 |  |  |  |
|  |  |  | r4c7 | r4c6 | r4c5 | r4c4 | r4c3 | r4c2 | r4c1 | r4c0 |  |  |  |  |
|  |  | r5c7 | r5c6 | r5c5 | r5c4 | r5c3 | r5c2 | r5c1 | r5c0 |  |  |  |  |  |
|  | r6c7 | r6c6 | r6c5 | r6c4 | r6c3 | r6c2 | r6c1 | r6c0 |  |  |  |  |  |  |
| r7c7 | r7c6 | r7c5 | r7c4 | r7c3 | r7c2 | r7c1 | r7c0 |  |  |  |  |  |  |  |

| 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|

Partial Product Term Columns

FIG. 1

| Column 9 | Column 8 | Column 7 | Column 6 | Column 5 | Column 4 |
|---|---|---|---|---|---|
| Height 6 | Height 7 | Height 8 | Height 7 | Height 6 | Height 5 |
|  |  | r0c7 |  |  |  |
|  | r1c7 | r1c6 | r0c6 |  |  |
| r2c7 | r2c6 | r2c5 | r1c5 | r0c5 |  |
|  |  |  |  |  | r0c4 |
|  |  |  |  |  | r1c3 |

(a)

| Column 9 | Column 8 | Column 7 | Column 6 | Column 5 | Column 4 |
|---|---|---|---|---|---|
| Height 7 | Height 7 | Height 7 | Height 7 | Height 7 | Height 4 |
| r0c7 AND r1c6 | r1c7 AND NOT r0c6 | r0c7 XOR r1c6 | r0c6 | r0c4 AND r1c3 |  |
| r2c7 | r2c6 | r2c5 | r1c5 | r0c5 |  |
|  |  |  |  |  | r0c4 XOR r1c3 |

```
(R0c4 XOR r1c3)  r0c3  r0c2  r0c1  r0c0
                 r1c3  r1c2  r1c1  r1c0
                       r2c2  r2c1  r2c0
                             r3c1  r3c0
```

(a)

(b)

(a)

(b)

```
                    r4c7
              r5c7  r5c6
        r6c7  r6c6  r6c5
   r7c7 r7c6  r7c5  r7c4
```

(a)

(b)

Ascending triangle compressor output term gate delay

| 0 | 1 | 2 | 3 | 4 | 5 |
|---|---|---|---|---|---|
| 1d | 2d | 4d | 4d | 5d | 5d |
|  |  |  |  |  | 4d |

(7;3) counter output term gate delay

| 5 | 6 | 7 | 8 | 9 | 10 | 11 |
|---|---|---|---|---|----|----|
| 4d | 5d | 5d |  |  |  |  |
|  | 4d | 5d | 5d |  |  |  |
|  |  | 4d | 5d | 5d |  |  |
|  |  |  | 4d | 5d | 5d |  |
|  |  |  |  | 4d | 5d | 5d |

Descending triangle compressor output term gate delay

| 10 | 11 | 12 | 13 | 14 | 15 |
|----|----|----|----|----|----|
| 4d | 4d | 5d | 6d | 7d | 7d |

(a)

Full adder input term gate delay

| 5 |
|---|
| 5d |
| 4d |
| 4d |

(b)

Full adder output term gate delay

| 5 | 6 |
|---|---|
| 6d | 6d |

| Second stage output column delay | | | |
|---|---|---|---|
| 0 | 1d | | |
| 1 | 2d | | |
| 2 | 4d | | |
| 3 | 4d | | |
| 4 | 5d | | |
| 5 | 6d | | |
| 6 | 5d | 4d | 6d |
| 7 | 5d | 5d | 4d |
| 8 | 5d | 5d | 4d |
| 9 | 5d | 5d | 4d |
| 10 | 4d | 5d | 5d |
| 11 | 4d | 5d | |
| 12 | 5d | | |
| 13 | 6d | | |
| 14 | 7d | | |
| 15 | 7d | | |

FIG. 12

| Third stage output column delay | | | |
|---|---|---|---|
| 0 | 1d | | |
| 1 | 2d | | |
| 2 | 4d | | |
| 3 | 4d | | |
| 4 | 5d | | |
| 5 | 6d | | |
| 6 | 7d | | |
| 7 | 7d | 7d | |
| 8 | 7d | 7d | |
| 9 | 7d | 7d | |
| 10 | 7d | 7d | |
| 11 | 6d | 7d | |
| 12 | 5d | 6d | |
| 13 | 6d | | |
| 14 | 7d | | |
| 15 | 7d | | |

FIG. 13

US 10,025,557 B2

8X8 BINARY DIGITAL MULTIPLIER

FIELD OF THE INVENTION

The present invention is in the field of semiconductor, and particularly binary digital arithmetic.

BACKGROUND

As process technologies have scaled to smaller feature sizes, the size of transistors has scaled faster than the size of interconnecting wires. Therefore, wires take proportionally more area and the die area silicon cost benefits of process technology scaling is limited by wires.

Many chips, particularly ones oriented towards signal processing or highly parallel processing, comprise thousands of binary digital multipliers. Each multiplier comprises at least some of half adders, full adders, counters, compressors, and a carry propagate adder. Different organizations of gates and wires within each such component, and their interconnectivity, affect the total logic switching delay and wire density.

An 8×8 multiplier is a common, useful logic component within many chips. It can be used alone for multiplying 8-bit numbers to generate a 16-bit result, or as part of a larger multiplier for multiplying larger numbers. Conventional 8×8 multipliers have a middle column of partial product summation that has a height of 8 terms, which limits the multiplier logic speed. Using conventional compressors on the middle column requires undesirable numbers of inter-column wires, which reduce wire density, and therefore increase silicon area cost.

What is needed is an 8×8 multiplier with fewer wires, especially wires crossing columns of partial product summation.

SUMMARY OF THE INVENTION

The disclosed invention is directed towards multipliers capable of 8×8 binary digital multiplication with fewer wires, especially wires crossing columns of partial product summation.

After a first stage of ANDs between multiplicand and shifted copies of the multiplier input, recoding is used to reduce the height of the middle column (column 7) of partial product terms from 8 to 7 in a second multiplier stage. Also, columns 6, 8, and 9 are made to have height 7. Each of the five columns, 5 through 9, is input to a (7:3) counter. The total gate delay is 4d for the LSB produced by column 5 and 5d for each of the other two counter outputs.

Note that a (7:3) counter is logically the same as a (7:3) compressor. The distinction in terminology being that a compressor has an input from another column, but the inputs of a counter are all within a single column. By using a (7:3) compressor across multiple columns, multiple cross-column wires are needed, whereas using a (7:3) counter on a column requires no cross-column wires.

An efficient descending triangle compressor is used on columns 10 to 14. It produces outputs, including carries, with delay of 4d, 4d, 5d, 6d, 7d, and 7d for each of columns 10 to 15 respectively.

An efficient ascending triangle compressor is used on columns 0 to 4. It produces outputs with delay of 1d, 2d, 4d, 4d, and 5d for each of columns 0 to 4, respectively. It also produces two outputs with the weight of column 5, having 5d and 4d gate delay, respectively. A full adder is used on the two column 5 terms of the ascending triangle compressor and the column 5 result of the least significant (7:3) counter to reduce those three to one column 5 and one column 6 term with a total of 6d delay from the original compressor and counter inputs.

When combined, including the common column terms from triangle compressors and (7:3) counters, the extreme columns 0 to 5 and 12 to 15 all have a single term, and therefore do not need to participate in any further compression or final addition. Column 11 has a height of two and columns 10 to 6 have height 3.

In a third stage full adders are used to reduce column 6 to a height of 1, columns 10 to 8 to a height of two, and increase column 12 to a height of two. Resulting gate delays from third stage inputs for column 0 to 6 are: 1d, 2d, 4d, 4d, 5d, 6d, and 7d. Resulting gate delays from third stage inputs for columns 13 to 15 are: 7d, 7d, and 6d. Columns 7 to 12, respectively, have terms with delay 7d and 7d, 7d and 7d, 7d and 7d, 7d and 7d, 6d and 7d, 5d and 6d.

All terms are added in a fourth stage using, according to some embodiments, a carry propagate adder with 7d gate delay. This yields a maximum delay of 14d for any multiplier term.

BRIEF DESCRIPTION OF THE DRAWINGS

FIG. 1 illustrates the identifiers of the bits of the partial product bits of an 8×8 multiplier.

FIG. 2 illustrates the use of upper terms in reducing all columns to a height of 7 or less.

FIG. 11 illustrates gate delay tables for each column bit output from compressors according to the invention.

FIG. 12 illustrates a gate delay table for the second stage of a multiplier according to the invention.

FIG. 13 illustrates a gate delay table for the third stage of a multiplier according to the invention.

DETAILED DESCRIPTION

Figure 3:
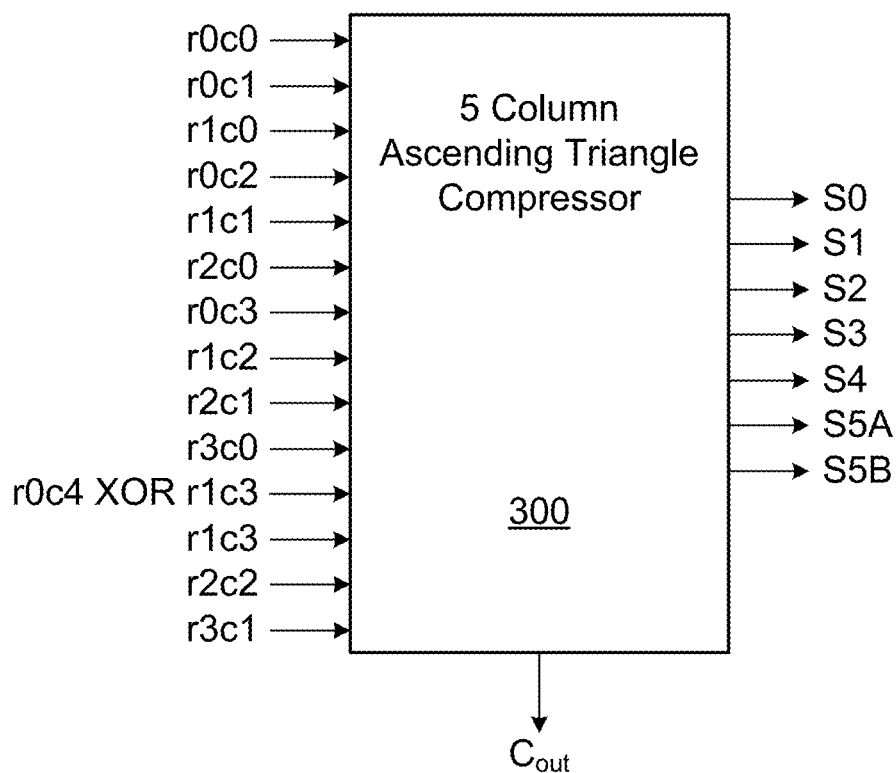
FIG. 3 illustrates a 5 column ascending triangle compressor according to the invention, and the partial product bits that it processes.

The invention concerns the wire delay cost of multiplier logic. Furthermore, it concerns the logic-area density cost of cross-column wires. Cross-column wires are ones that cross between columns of multiplier terms. The invention concerns units comprising half adders, full adders, counters, compressors, and a carry propagate adder. The invention is an 8×8 binary digital multiplier that has fewer and shorter wires than a Booth or modified Booth multiplier. Like most 8×8 binary digital multipliers, it has a first stage of bit-wise AND gates of the multiplicand and successively 1-bit left-shifted copies of the multiplier. This creates a parallelogram of eight rows and 15 columns of partial product bits to be summed. FIG. 1 shows the 15 columns, and each partial product bits, labeled by its row r and column c position. The invention implements a method and semiconductor chip with a particularly fast and efficient way to sum the partial product bits.

Below, various aspects of the invention are disclosed and discussed. Each, alone, is novel, as is their combination. It will be appreciated by those skilled in the art that many variations can be made, such as by switching the order of certain inputs to some units or by switching the order of the staging of certain units or by using fully or partially functional equivalents of certain units.

Reducing the Height of Column 7 from 8 Rows to 7

The invention comprises a particularly fast, efficient (7:3) compressor. Using it requires that the height of multiplier column 7 be reduced from height 8 to height 7. Column 7 is the only column with height 8.

FIG. 2(a) shows, according to an aspect of the invention, the middle columns of the partial products to be summed for each bit representing the logical AND of a multiplicand term and a term of a shifted copy of the multiplier. Also shown is the height of each column, and the row and column terms used in the reduction. Note that for FIG. 2 columns are aligned to the lowest row so as to form a triangle of terms, rather than the parallelogram of FIG. 1. Furthermore, FIG. 2 only shows certain relevant terms near the top of the triangle.

According to the invention, add r0c7 to r1c6 in Column 7:

Column 7 sum=(r0c7) XOR (r1c6)
Carry into column 8=(r0c7) AND (r1c6)=r0r1c6c7
Add the Carry=r0r1c6c7 to (r1c7) in Column 8:
Sum=(r1c7) XOR r0r1c6c7=r1c7 AND (1 XOR r0c6)= (r1c7) AND NOT (r0c6)
Carry=(r0r1c6c7)=(r1c7) AND (r0c6)

As shown in FIG. 2(b), all five resulting columns 5, 6, 7, 8, 9 now have height 7. This makes each column suitable for a (7:3) Counter or Compressor:

Note: the 4 complex terms have 2 gate delays (2d). All other terms have 1 AND2 gate delay (1d).

Note: Column 4 and Column 5 both have (r0c4) and (r1c2) terms, so each could be either a 2nd gate or else a wire, if the output transistors are sized for a fan-out of two and if wiring is available.

Note: Column 6 has (r0 c6) and Column 7 has NOT (r0c6) terms, so one could be either a 2nd gate or else a wire, if the output transistors are sized for a fan-out of two and if wiring is available.

Note: Columns 8 and 9 both have (r0c7) and (r1c5) terms, so each could be either a 2nd gate or a wire, if the output transistors are sized for a fan-out of two and if wiring is available.

Note: The Column 9 complex term, (r0c7) AND (r1c5), could have been computed instead as (r1c6) AND (r0c6), so the Column 9 terms (r1c6) and (r0c6) would be the same as in Column 7. However, this would mean two longer wires crossing two columns, not just one, as shown here.

Note: Columns 5, 6, 7, 8, 9 all have height 7.

Note: In the embodiment of FIG. 2(b) an additional transformation is performed on r0c4 and r1c3. This takes advantage of being able to use a (7:3) compressor on column 5 and also in order to reduce the height of column 4 to just 4 terms.

Ascending Triangle Compressor

According to an aspect of the invention, an ascending triangle compressor is used to compress 14 terms of the five rightmost columns of the partial product sums. FIG. 3(a) shows the ascending triangle compressor input terms as organized on the right side of the partial product sums. FIG. 3(b) shows ascending triangle compressor 300 with its 14 inputs, 7 outputs, and one carry-out.

The resultant column height of output terms for columns 5 to 0 is {2,1,1,1,1,1}. Note that this allows the final stage carry propagate adder to be shortened since columns 0 through 4, having a height of just one term, do not have to participate in the final carry propagate adder.

Figure 4:
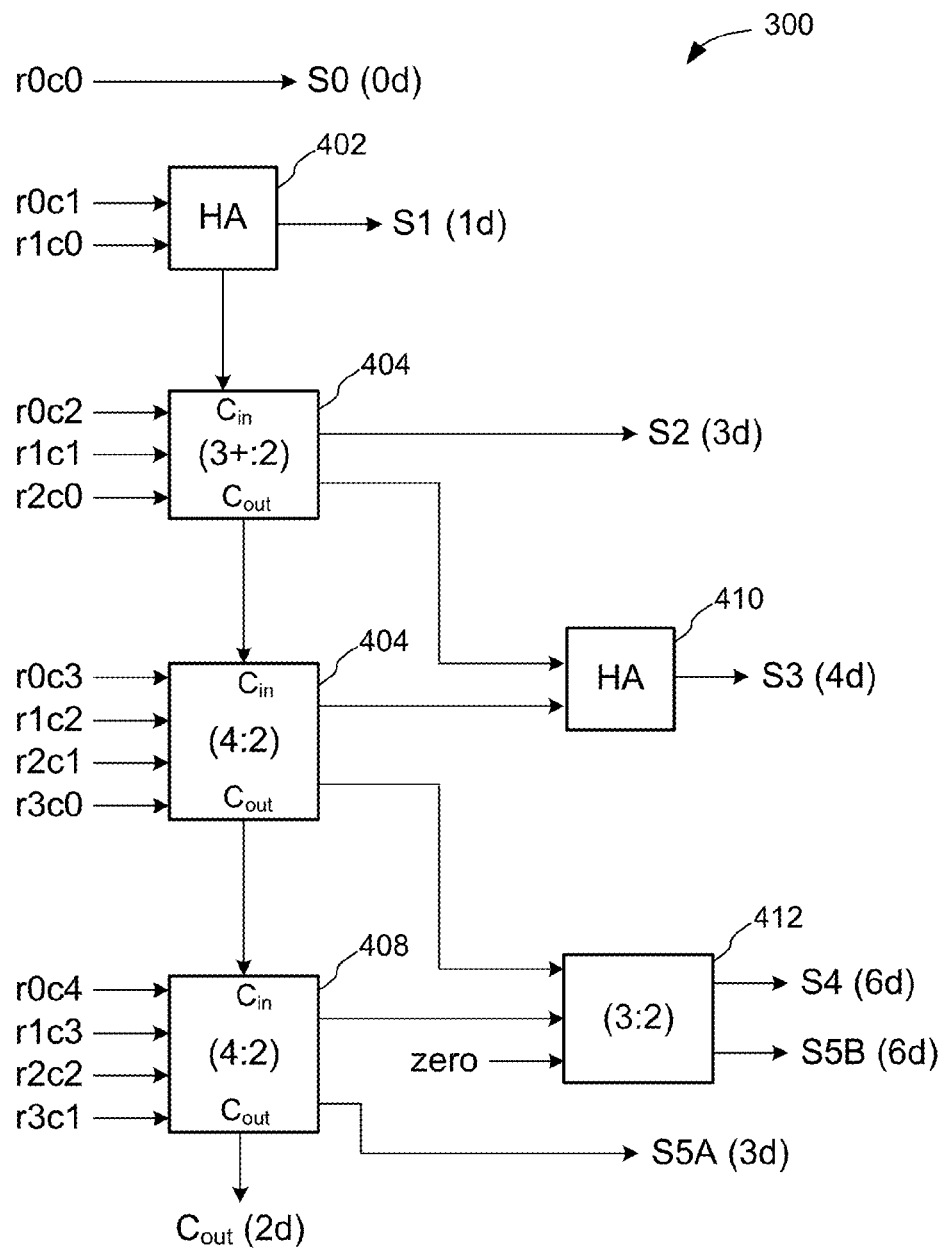
FIG. 4 illustrates the connection of components within a 5 column ascending triangle compressor according to the invention.

FIG. 4 shows the construction of the ascending triangle compressor of FIG. 3. The first rank comprises half adder 402, (3+:2) compressor 404, (4:2) compressor 406, and (4:2) compressor 408. The first rank produces a {1,3,2,1,1} result. Note: A (3+:2) compressor compresses 3 terms plus a carry-in term to 2 terms.

The second rank comprises half adder 410 and (3:2) Compressor 412. A zero value is input to the second rank instance of the (3:2) compressor. This gives the {2,1,1,1,1,1} result of outputs S5B and S5A, for use in the next column, and the final results S4, S3, S2, S1, and S0. The effective gate delays of output S0, S1, S2, S3, S4, S5B, and S5A are 0d, 1d, 3d, 4d, 6d, 6d, and 3d respectively.

Figure 5:
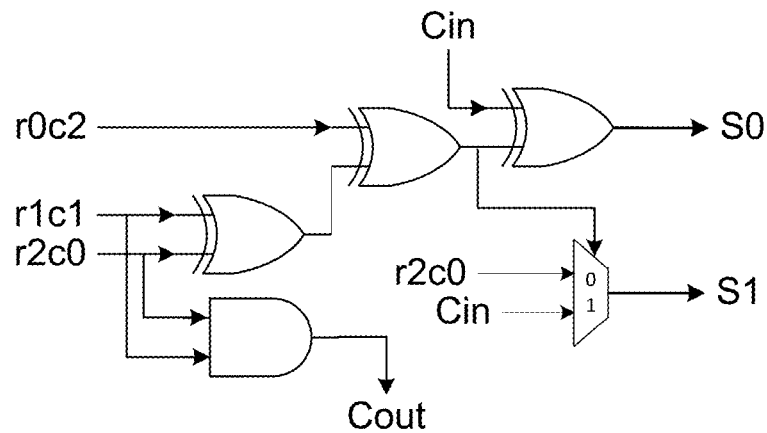
FIG. 5 illustrates the logic gates and input/output delays of a (3+:2) compressor according to the invention.
Figure 5:
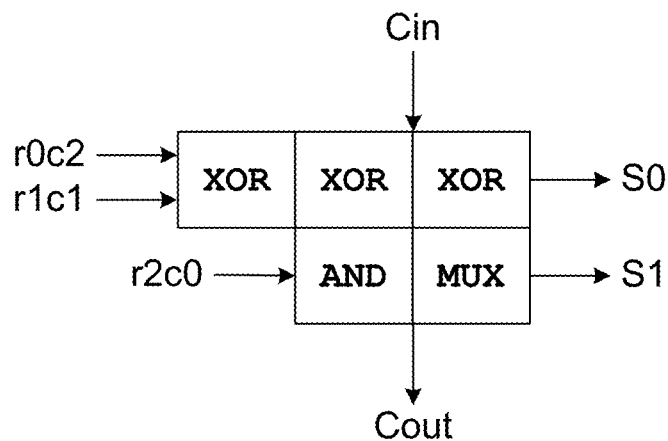

Note that for column 2 (inputs r0c2, r1c1, and r2c0) a zero can be added to the column without changing the results so that this column can be considered to be (r0c2, r1c1, r2c0, zero). This column can be handled by a (4:2) compressor, where one input term is 0. This is referred to as a (3+:2) compressor. FIG. 5(a) shows the logic for (3+:2) compressor 404. FIG. 5(b) shows the time (left to right) required of inputs and available of outputs at each stage in the compressor.

Ascending triangle compressor 300 produces 7 weighted outputs, a carry out to the next column summation logic. The longest output delay is to the final multiplication results output at S4 and compressed partial sum S5B, each with 6 effective gate delays.

Descending Triangle Compressor

According to an aspect of the invention, a descending triangle compressor is used to compress 10 terms of the four leftmost columns of the partial product sums. FIG. 6(a) shows the descending triangle compressor input terms as organized on the left side of the partial product sums. FIG. 6(b) shows descending triangle compressor 600 with its 10 inputs, 5 outputs, and 1 carry-in.

This gives resultant terms S0, S1, S2, S3, and S4 with column of {1,1,1,1,1}. Note that this allows the final stage carry propagate adder to be further shortened since columns 15 through 11, having a height of just one term, do not have to participate in the final carry propagate adder, which can be replaced by an incrementer. The effective gate delays of outputs S0, S1, S2, S3, and S4 are 3d, 4d, 5d, 6d, and 6d respectively.

Figure 6:
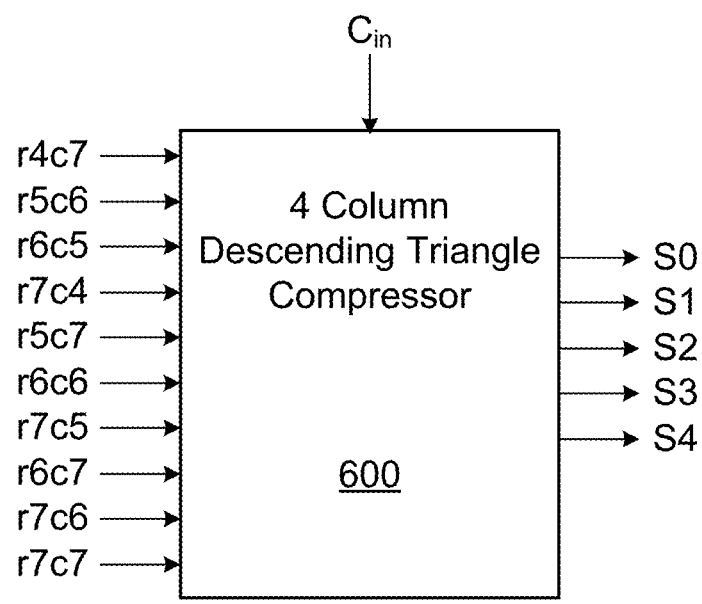
FIG. 6 illustrates a 4 column descending triangle compressor according to the invention, and the partial product bits that it processes.
Figure 7:
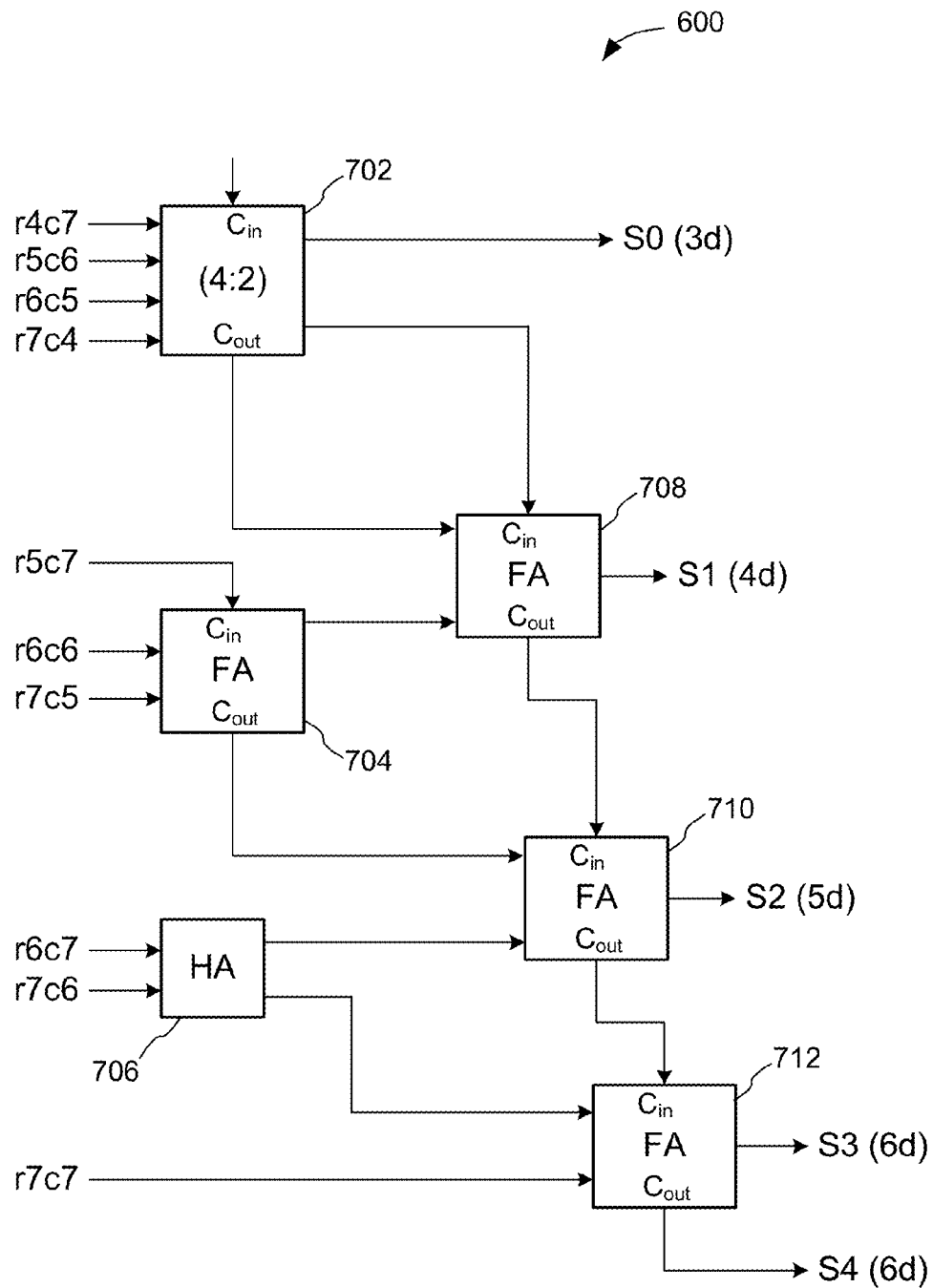
FIG. 7 illustrates the connection of components within a 4 column descending triangle compressor according to the invention.

FIG. 7 shows the construction of the descending triangle compressor of FIG. 6. A first rank comprises (4:2) compressor 702, full adder 704, and half adder 706. A second, third, and fourth rank comprise full adder 708, full adder 710, and full adder 712 respectively. They have 6d, 6d, 5d, 4d, and 3d effective gate delays, respectively. Only one long Carry In and one long Carry Out wires are required for this circuit.

Descending triangle compressor 600 produces 5 weighted outputs. The longest output delay is to the final multiplication results output at S3 and S4, each with 6 effective gate delays.

(7:3) Counter

Figure 8:
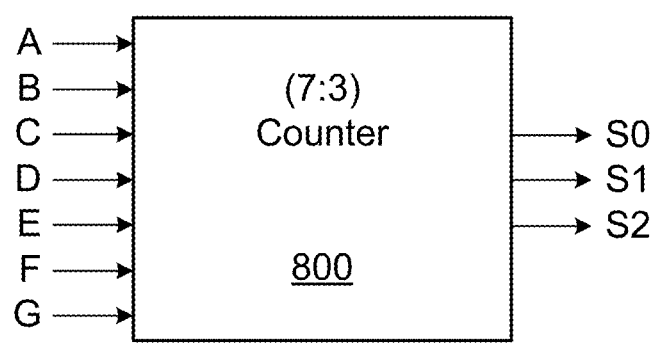
FIG. 8 illustrates a 7:3 counter according to the invention.

According to an aspect of the invention, (7:3) counters are used to compress partial product bits. Each compresses 7 terms. FIG. 8 shows (7:3) counter 800 with its 7 inputs and three outputs. The input terms are labelled A, B, C, D, E, F, and G. The three output terms are S0, S1, and S2.

Figure 9:
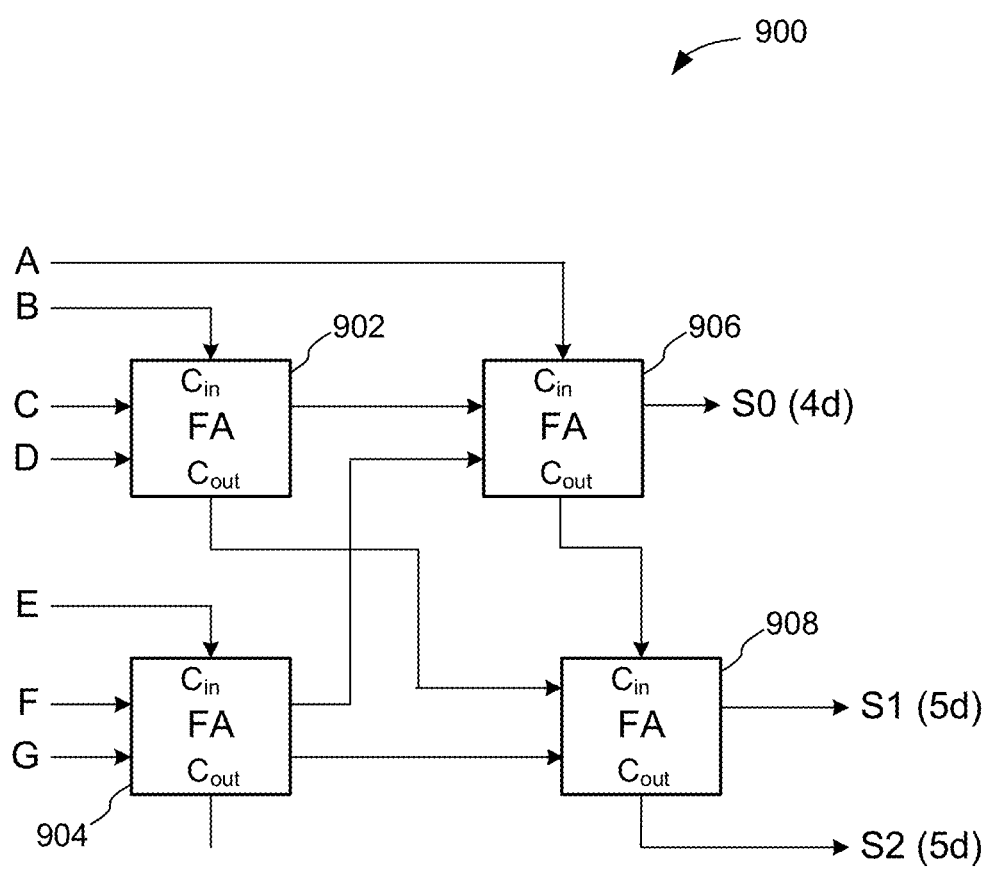
FIG. 9 illustrates the connection of components within a 7:3 counter according to the invention.

FIG. 9 shows the construction of (7:3) 900 counter according to one embodiment of the invention. A first rank comprises full adder 902, and full adder 904. A second rank comprises full adder 906 and full adder 908. This gives resultant terms S0, S1, and S2, having effective gate delays of 4d, 5d, and 5d respectively.

Figure 10:
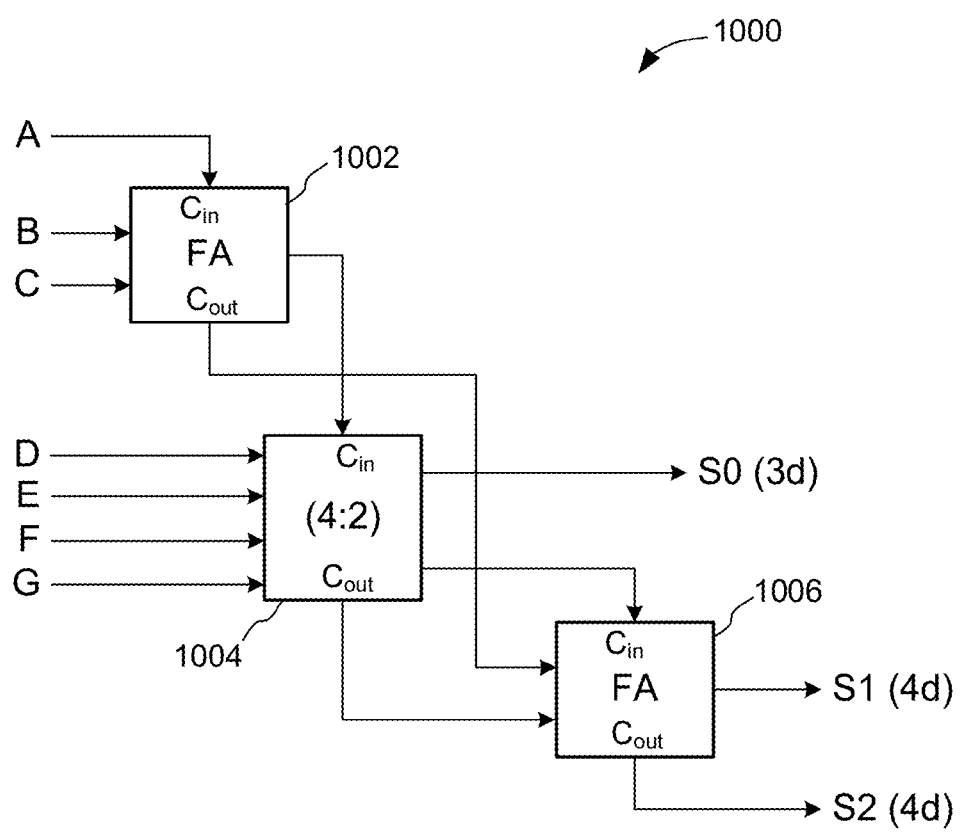
FIG. 10 illustrates the connection of components within a 7:3 counter according to the invention.

FIG. 10 shows the construction of (7:3) counter 1000 according to one embodiment of the invention. A first rank comprises full adder 1002. A second rank comprises (4:2) compressor 1004. A third rank comprises full adder 1006. This gives resultant terms S0, S1, and S2, having effective gate delays of 3d, 4d, and 4d respectively.

Consider a column of 7 input terms driving inputs A, B, C, D, E, F, and G, where the terms have effective input delays of 2d, 1d, 1d, 1d, 1d, 1d, and 1d respectively. In the embodiment of FIG. 10, the Cin term for (4:2) compressor 1004, uses the sum output of full adder 1002 (available at time 3d, and exactly at the time needed by (4:2) compressor 1004). This is better than using Cin from the previous column, because it saves a column-crossing Wire.

(7:3) counter 1000 uses two full adders (3 gates each), one (4:2) Compressor (6 gates). In combination with the 6 AND2 gates for stage one of the 6 multiplier input terms, a single-column (7:3) counter for the first and second stage can be implemented as an 18 gate macro cell with effective output gate delays of 4d, 4d, and 3d. This 18 gate (7:3) compressor has 13 inputs (one complex input and 6 X and 6 Y multiplier inputs) but only 3 outputs—which means only 3 final output wires to drive. All other internal gates drive either one or two following gates. The circuitry of (7:3) counter 1000 lends itself to an efficient implementation as a macro cell with a hand-optimized layout.

Combining Ascending Triangle Compressor, (7:3) Counters, and Descending Triangle Compressor According to some embodiments of the invention, four sequential stages are used to determine the final multiplier result. The first stage is one of ANDing the multiplier input with each of eight sequentially bit shifted copies of the multiplicand in order to create a parallelogram of partial product bits.

The second stage comprises:

one ascending triangle compressor with inputs from columns 1, 2, 3, 4, and 5.

five (7:3) counters, each with inputs from one of 7-high columns 5, 6, 7, 8, 9, 10, and 11; and one descending triangle compressor with inputs from columns 12, 13, 14, and 15;

FIG. 11(*a*) shows a table of delay for each output term of the compressors. The descending triangle compressor has 5 outputs, one weighted for each of columns 15 to 10. The ascending triangle compressor has 7 outputs, one weighted for each of columns 0 to 4, and two outputs weighted for column 5. Five (7:3) counters, having column weights of 5-7, 6-8, 7-9, 8-10, and 9-11 respectively. The recoding to make Column 7 have Height 7 also made Column 4 have one delayed input.

Column 5 requires adding terms from both of the least significant output bit (S0) of the least significant (7:3) counter and the two most significant (S5) terms of the ascending triangle compressor. In order to be able to instantiate multiple identical 18-gate macros for the (7:3) compressors of columns 5 through 10, a full adder is used on the two ascending triangle compressor S5 outputs and the column 5 (7:3) counter S0 output to produce a column sum for column 5 and carry out to column 6 for the next stage. FIG. 11(*b*) shows the delay of each term (5d, 4d, and 4d). They can be added with a full adder to create a column 5 term and column 6 term, as shown in FIG. 11(*c*), each with 6d gate delay.

FIG. 12 shows a table of delay for the combined outputs of all compressors and the column 5 full adders. Note that columns 15 to 12 and 5 to 0 each have a single term, each of which can directly drive a product bit. Columns 10 to 6 each have three terms, and column 11 has two terms.

In the third stage five full adders are used on columns 6 to 10 and a half adder on column 11. The result terms are shown in FIG. 13. Each sum adds one gate delay and each carry out to the next column adds two gate delays. The result is a single term for column 6 and two terms for each of columns 7 to 12.

In the fourth stage a carry propagate adder is used on columns 7 to 12, with resulting carries through column 15. This reduces two rows to one resulting product row with +7 gate delays. This yields a maximum gate delay of 14d for columns 7 to 15.

Some embodiments add latches between stages to create a pipelined multiplier.

Interpretation of Embodiments

Embodiments of the invention described herein are merely exemplary, and should not be construed as limiting of the scope or spirit of the invention as it could be appreciated by those of ordinary skill in the art. The disclosed invention is effectively made or used in any embodiment that comprises any novel aspect described herein. All statements herein reciting principles, aspects, and embodiments of the invention are intended to encompass both structural and functional equivalents thereof. It is intended that such equivalents include both currently known equivalents and equivalents developed in the future. Since all two-input elemental logic gates satisfy the commutative property, claims listing terms combined by two-input logic gates in either order are equivalent. Many equivalent transformations of logic functions are known to persons having ordinary skill in the art. All such equivalents should be construed as equivalents of the logic functions claimed.

What is claimed is:

1. An ascending triangle compressor for compressing 14 terms of the five rightmost columns of partial products of a binary digital multiplier to produce single sum terms for each of five columns and two sum terms for a sixth column, the ascending triangle compressor comprising:

a first half adder having inputs for both of the bits of the second least significant column and an output for the second least significant sum term;

a (3+:2) compressor having inputs for each of the three bits of the third least significant column and an output for the third least significant sum term;

a first (4:2) compressor having inputs for each of the four bits of the fourth least significant sum term;

a second (4:2) compressor having inputs for four of the five bits of the fifth least significant column and an output for the first of the two sixth least significant sum terms;

a second half adder having an input from the (3+:2) compressor and an input from the first (4:2) compressor, and an output for the fourth least significant sum term; and a (3:2) compressor having an input from the first (4:2) compressor, an input from the second (4:2) compressor, and output for the fifth least significant sum term, and an output for the second of the a sixth least significant sum terms.

2. A descending triangle compressor for compressing the ten terms of the four leftmost columns of partial products of a binary digital multiplier to produce single sum terms for each of five columns, the descending triangle compressor comprising:

a (4:2) compressor having inputs for each of the four bits of the least significant column and an output for the least significant sum term;

a first full adder having inputs for each of the three bits of the second least significant column;

a half adder having inputs for both of the bits of the third least significant column;

a second full adder having inputs for each of two outputs of the (4:2) compressor, an input for an output of the first full adder, and an output for the second least significant sum term;

a third full adder having in an input for an output of the second full adder, an input for an output of the first full adder, an input for an output of the half adder, and an output for the third least significant sum term; and a fourth full adder having an input for an output of the third full adder, an input for an output of the half adder, and an input for the bit of the fourth least significant column an output for fourth least significant sum term, an output for the fifth least significant sum term.

3. A (7:3) counter comprising:

a first full adder for adding a first through third input term, the full adder having a carry in input for the first term and a data input for each of the second and third term, a first output and a second output;

a (4:2) compressor for adding a fourth through seventh input term and producing a least significant count bit, the (4:2) compressor having a data input for each of the four input terms, a carry in input, a first output for the least significant count bit, a second output, and a third output; and a second full adder for producing the two most significant count bits, the second full adder having a first input, a second input, and a third input, and a data output for the middle count bit, and a carry out output for the most significant count bit, wherein:

the first output of the first output of the first full adder is coupled to the carry in input of the (4:2) compressor;

the second output of the first full adder is coupled to the second input of the second full adder, the second output of the (4:2) compressor is coupled to the first input of the second full adder, and the third output of the (4:2) compressor is coupled to the third input of the second full adder.

4. The (7:3) counter of claim 3 wherein:

the first output of the first full adder is a data output and the second output of the first full adder is a carry out;

the second output of the (4:2) compressor is a data output and the third output of the (4:2) compressor is a carry out; and the first input of the second full adder is a carry in, the second input of the second full adder is a data input, and the third input of the second full adder is a data input.

5. An 8×8 binary digital multiplier comprising:

an AND gate with inputs r0c7 and r1c6 and an output in partial product column 9;

a NAND gate with inputs r1c7 and r0c6 and an output in partial product column 8;

an XOR gate with inputs r0c7 and r1c6 and an output in partial product column 7;

an AND gate with inputs that are two different terms selected from the set consisting of r0c4, r1c3, r2c2, and r3c1 and an output in partial product column 5; and an XOR gate with inputs that are the two chosen terms and an output in partial product column 4.

6. The 8×8 binary digital multiplier of claim 5 wherein the two chosen terms are r0c4 and r1c3.

* * * * *